(12) United States Patent
Chang et al.

(10) Patent No.: US 7,218,155 B1
(45) Date of Patent: May 15, 2007

(54) TECHNIQUES FOR CONTROLLING ON-CHIP TERMINATION RESISTANCE USING VOLTAGE RANGE DETECTION

(75) Inventors: Tzung-Chin Chang, San Jose, CA (US); Xiaobao Wang, Cupertino, CA (US); Henry Kim, San Jose, CA (US); Chiakang Sung, Milpitas, CA (US); Khai Q. Nguyen, San Jose, CA (US); Bonnie Wang, Cupertino, CA (US); Jeffrey Tyhach, Sunnyvale, CA (US); Gopinath Rangan, San Francisco, CA (US)

(73) Assignee: Altera Corporation, San Jose, CA (US)

( * ) Notice: Subject to any disclaimer, the term of this patent is extended or adjusted under 35 U.S.C. 154(b) by 1 day.

(21) Appl. No.: 11/040,343

(22) Filed: Jan. 20, 2005

(51) Int. Cl.
*H03B 1/00* (2006.01)

(52) U.S. Cl. .................... 327/108; 326/30
(58) Field of Classification Search ............. 327/306, 327/309, 108, 112; 326/30, 87
See application file for complete search history.

(56) References Cited

U.S. PATENT DOCUMENTS

| | | | |
|---|---|---|---|
| 4,719,369 A | 1/1988 | Asano et al. | 326/30 |
| 4,954,729 A | 9/1990 | Urai | 326/27 |
| 5,111,081 A | 5/1992 | Atallah | 326/32 |
| 5,134,311 A | 7/1992 | Biber et al. | 327/108 |
| 5,164,663 A | 11/1992 | Alcorn | 714/734 |
| 5,179,300 A | 1/1993 | Rolandi et al. | 326/83 |
| 5,359,235 A | 10/1994 | Coyle et al. | 327/108 |
| 5,374,861 A | 12/1994 | Kubista | 326/30 |
| 5,592,510 A | 1/1997 | Van Brunt et al. | 375/220 |
| 5,602,494 A | 2/1997 | Sundstrom | 326/39 |
| 5,623,216 A | 4/1997 | Penza et al. | 326/27 |
| 5,656,953 A | 8/1997 | Whetsel | 326/83 |
| 5,726,582 A | 3/1998 | Hedberg | 326/30 |
| 5,726,583 A | 3/1998 | Kaplinsky | 326/30 |
| 5,764,080 A | 6/1998 | Huang et al. | 326/41 |
| 5,864,715 A | 1/1999 | Zani et al. | 710/63 |
| 5,939,896 A | 8/1999 | Hedberg | 326/30 |
| 5,955,911 A | 9/1999 | Drost et al. | 327/404 |
| 5,970,255 A | 10/1999 | Tran et al. | 710/73 |
| 6,008,665 A | 12/1999 | Kalb et al. | 326/30 |
| 6,020,760 A | 2/2000 | Sample et al. | 326/41 |

(Continued)

OTHER PUBLICATIONS

"Apex 20K Programmable Logic Device Family ver. 3.7," product data sheet Altera Corporation, San Jose, CA (May 2001).

(Continued)

*Primary Examiner*—Timothy P. Callahan
*Assistant Examiner*—Hai L. Nguyen
(74) *Attorney, Agent, or Firm*—Townsend and Townsend and Crew LLP

(57) ABSTRACT

Techniques are provided for controlling an on-chip termination resistance in an input or output (IO) buffer using a calibration circuit. The calibration circuit monitors the voltage between an external resistor and a group of on-chip transistors. When voltage between the external resistor and the group of transistors is within a selected range, the calibration circuit causes the effective resistance of the transistors to match the resistance of the external resistor as closely as possible. The calibration circuit enables another set of transistors in the IO buffer so that the effective on resistance of the transistors in the IO buffer closely match the resistance of the external resistor.

23 Claims, 12 Drawing Sheets

U.S. PATENT DOCUMENTS

| | | | | |
|---|---|---|---|---|
| 6,026,456 | A | 2/2000 | Ilkbahar | 710/100 |
| 6,037,798 | A | 3/2000 | Hedberg | 326/30 |
| 6,049,255 | A | 4/2000 | Hagberg et al. | 331/17 |
| 6,064,224 | A | 5/2000 | Esch, Jr. et al. | 326/30 |
| 6,087,847 | A | 7/2000 | Mooney et al. | 326/30 |
| 6,097,208 | A | 8/2000 | Okajima et al. | 326/26 |
| 6,100,713 | A | 8/2000 | Kalb et al. | 326/30 |
| 6,118,310 | A | 9/2000 | Esch | 327/108 |
| 6,147,520 | A | 11/2000 | Kothandaraman et al. | 327/77 |
| 6,154,060 | A | 11/2000 | Morriss | 326/86 |
| 6,157,206 | A | 12/2000 | Taylor et al. | 326/30 |
| 6,181,157 | B1 | 1/2001 | Fiedler | 326/30 |
| 6,236,231 | B1 | 5/2001 | Nguyen | 326/30 |
| 6,252,419 | B1 | 6/2001 | Sung et al. | 326/38 |
| 6,307,791 | B1 * | 10/2001 | Otsuka et al. | 365/189.05 |
| 6,329,836 | B1 | 12/2001 | Drost et al. | 326/30 |
| 6,356,106 | B1 | 3/2002 | Greeff et al. | 326/30 |
| 6,362,644 | B1 | 3/2002 | Jeffrey et al. | 326/30 |
| 6,366,128 | B1 | 4/2002 | Ghia et al. | 326/83 |
| 6,411,126 | B1 | 6/2002 | Tinsley et al. | 326/83 |
| 6,414,512 | B1 | 7/2002 | Moyer | 326/30 |
| 6,424,169 | B1 | 7/2002 | Partow et al. | 326/30 |
| 6,433,579 | B1 | 8/2002 | Wang et al. | 326/38 |
| 6,445,245 | B1 | 9/2002 | Schultz et al. | 327/541 |
| 6,448,813 | B2 | 9/2002 | Garlepp et al. | 326/83 |
| 6,456,124 | B1 * | 9/2002 | Lee et al. | 327/108 |
| 6,466,063 | B2 | 10/2002 | Chen | 327/112 |
| 6,489,837 | B2 | 12/2002 | Schultz et al. | 327/541 |
| 6,504,397 | B1 | 1/2003 | Hart et al. | 326/30 |
| 6,549,036 | B1 * | 4/2003 | Lee | 326/83 |
| 6,570,402 | B2 * | 5/2003 | Koo et al. | 326/30 |
| 6,586,964 | B1 | 7/2003 | Kent et al. | 326/30 |
| 6,590,413 | B1 | 7/2003 | Yang | 326/30 |
| 6,603,329 | B1 | 8/2003 | Wang et al. | 326/30 |
| 6,605,958 | B2 | 8/2003 | Bergman et al. | |
| 6,636,821 | B2 * | 10/2003 | Lawson | 702/107 |
| 6,639,397 | B2 | 10/2003 | Roth et al. | 324/158.1 |
| 6,642,741 | B2 | 11/2003 | Metz et al. | 326/30 |
| 6,700,823 | B1 | 3/2004 | Rahman et al. | 365/189.5 |
| 6,710,618 | B1 | 3/2004 | Murray | 326/30 |
| 6,747,475 | B2 | 6/2004 | Yuffe et al. | 326/30 |
| 6,766,155 | B2 | 7/2004 | Salcido et al. | 455/282 |
| 6,788,101 | B1 | 9/2004 | Rahman | 326/30 |
| 6,947,336 | B2 * | 9/2005 | Kim et al. | 365/189.05 |
| 2002/0010853 | A1 | 1/2002 | Trimberger et al. | 713/1 |
| 2002/0060602 | A1 | 5/2002 | Ghia et al. | 327/543 |
| 2002/0101278 | A1 | 8/2002 | Schultz et al. | 327/543 |
| 2003/0062922 | A1 | 4/2003 | Douglass et al. | 326/39 |
| 2004/0008054 | A1 | 1/2004 | Lesea et al. | 326/30 |

OTHER PUBLICATIONS

"Apex II Programmable Logic Device Family ver. 1.1," product Data Sheet, Altera Corporation San Jose, CA (May 2001).

Bendak et al. "CMOS VLSI Implementation of Gigabyte/second computer network links," proceedings of the 1996 IEEE International Symposium on Circuits and Systems 2:269-272 (May 1996).

Boni et al. "LVDS I/O Interface for Gb/s-per-Pin Operation in 0.35-um CMOS," IEEE Journal of Solid-State Circuits 36(4):706-711 (Apr. 2001).

Esch et al. "Theory and Design of CMOS HSTL I/O Pads," The Hewlett Packard Journal, pp. 46-52 (Aug. 1998).

"Spartan-3 1.2V FPGA Family: Functional Description, CA DS099-2 (v1.2)," product specifications Xilinx, Inc., San Jose (Jul. 11, 2003).

"Virtex-II 1.5V Field Programmable Gate Arrays, DSO3102 (v1.5)," product specifications Xilinx, Inc., San Jose, CA (Apr. 2, 2001).

"Virtex-II Platform FPGAs: Detailed Description, DS031-2 (v3.1)," product specifications Xilinx, Inc., San Jose, CA (Oct. 14, 2003).

"Virtex-II Pro Platform FPGAs: Functional Description, DS083-2 (v2.9)," product specifications Xilinx, Inc., San Jose, CA, (Oct. 14, 2003).

* cited by examiner

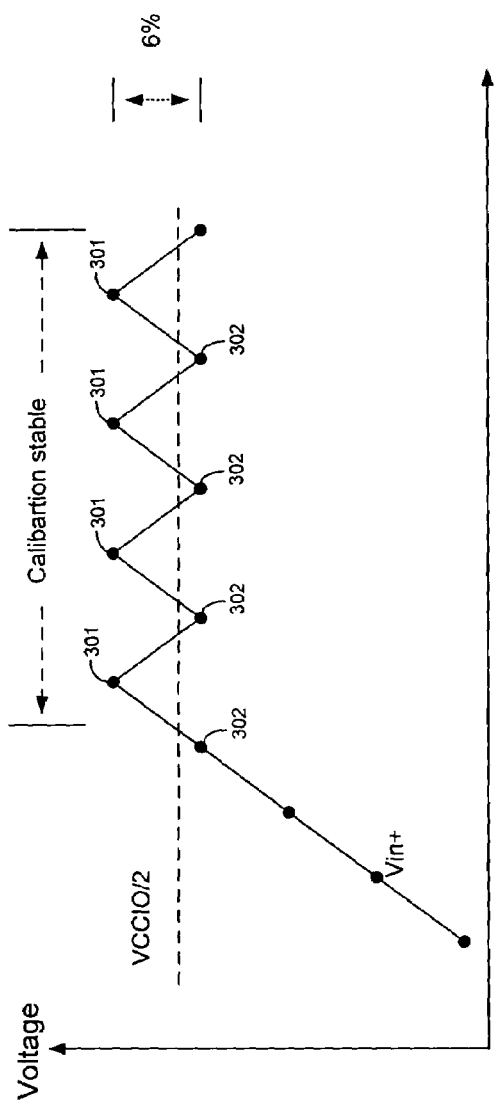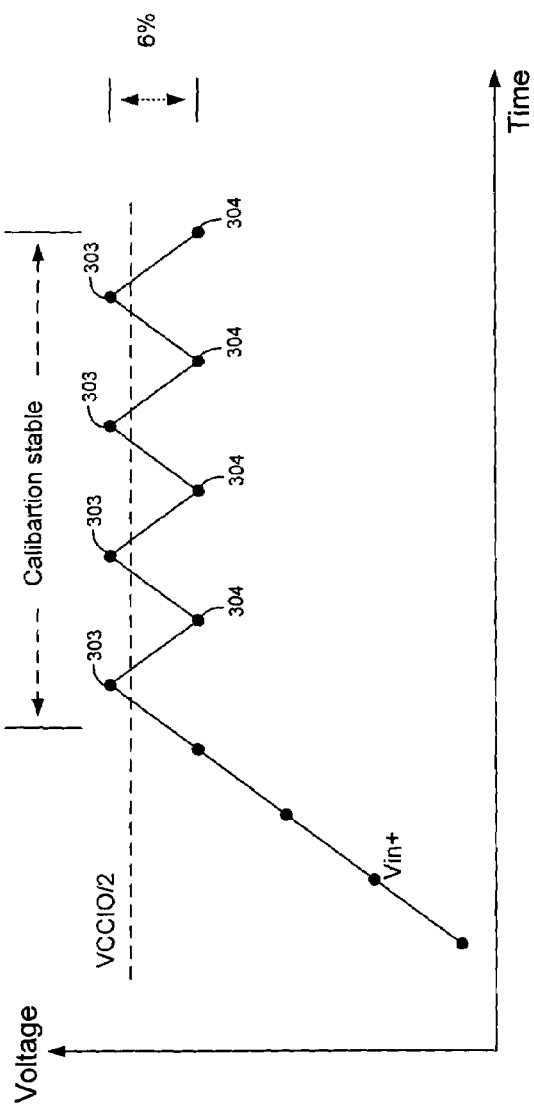

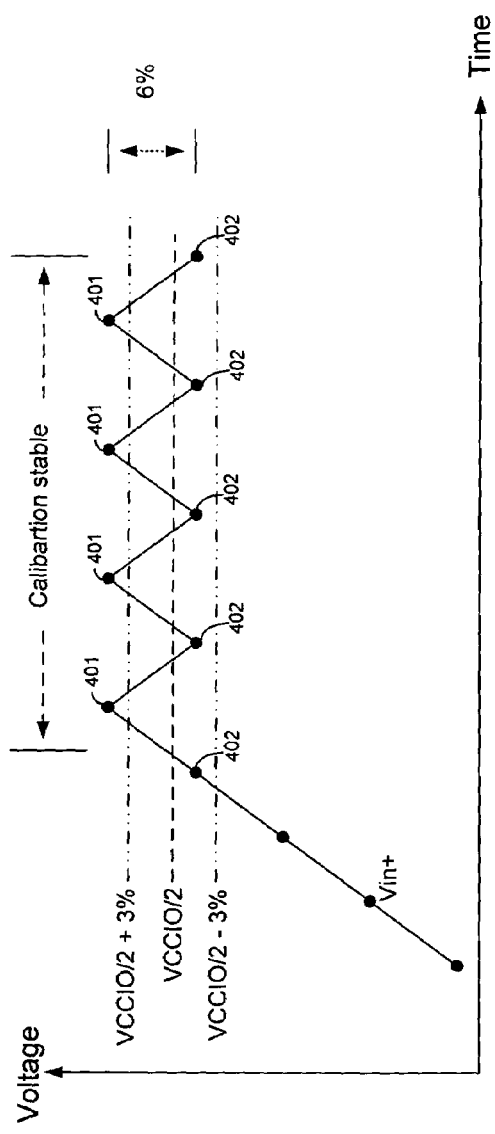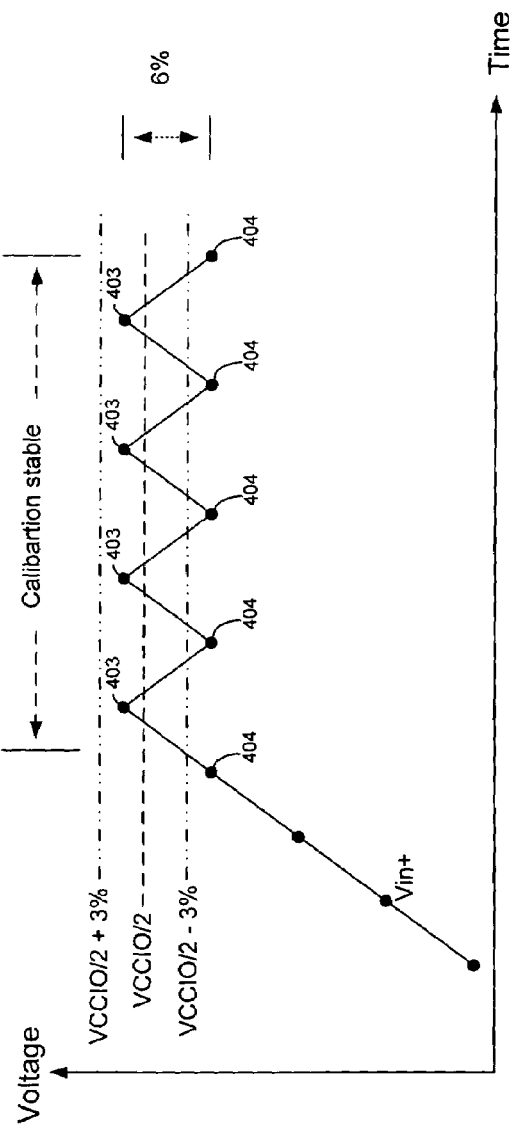

US 7,218,155 B1

TECHNIQUES FOR CONTROLLING ON-CHIP TERMINATION RESISTANCE USING VOLTAGE RANGE DETECTION

CROSS-REFERENCES TO RELATED APPLICATIONS

This patent application is related to commonly-assigned, co-pending U.S. patent application Ser. No. 11/040,048, filed Jan. 20, 2005, which is incorporated by reference herein.

BACKGROUND OF THE INVENTION

The present invention relates to techniques for controlling on-chip termination resistance using voltage regulation, and more particularly, to techniques for controlling an on-chip termination resistance by monitoring an effective resistance of on-chip transistors within a selected voltage range.

When transmitting signals over distances that are appreciable with respect to the signal period, mismatches between the impedance of the transmission line and that of the receiver cause signal reflection. The reflected signal interferes with the transmitted signal and causes distortion and degrades the overall signal integrity. To minimize or eliminate the unwanted reflection, transmission lines are resistively terminated by a matching impedance. In the case of integrated circuits that are in communication with other circuitry on a circuit board, termination is often accomplished by coupling an external termination resistor to the relevant input/output (I/O) pins.

For many of today's high speed integrated circuits, and particularly those that have large I/O pin counts, external termination poses a number of problems. A termination resistor is typically coupled to every I/O pin receiving an input signal from a transmission line. Often hundreds of termination resistors are needed for an integrated circuit. Numerous external termination resistors can consume a substantial amount of board space. The use of external components for termination purposes can be cumbersome and costly, especially in the case of an integrated circuit with numerous I/O pins.

Signal integrity is crucial in digital design because system speeds and clock edge rates continue to increase. To improve signal integrity, both single-ended and differential signals should be properly terminated. Termination can be implemented with external termination resistors on a board or with on-chip termination technology. On-chip termination eliminates the need for external resistors and simplifies the design of a circuit board.

It is desirable therefore to implement termination resistance on-chip to reduce the number of external components. It is also desirable to provide accurate control of an on-chip termination resistance.

BRIEF SUMMARY OF THE INVENTION

The present invention provides techniques for controlling an on-chip termination resistance in an input or output (IO) buffer using a calibration circuit. The calibration circuit monitors the voltage between an external resistor and a group of on-chip transistors. When voltage between the external resistor and the group of transistors is within a selected range, the calibration circuit causes the effective resistance of the transistors to match the resistance of the external resistor as closely as possible. The calibration circuit enables another set of transistors in the IO buffer so that the effective resistance of the transistors in the IO buffer closely match the resistance of the external resistor.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIGS. 3A–3C are graphs that illustrate changes in the voltage between an external resistor and a group of NMOS transistors shown in FIG. 2.

FIGS. 4A–4C are additional graphs that illustrate changes in the voltage between the external resistor and the group of NMOS transistors shown in FIG. 2 with respect to the voltage range detection circuitry.

DETAILED DESCRIPTION OF THE INVENTION

Figure 1A:
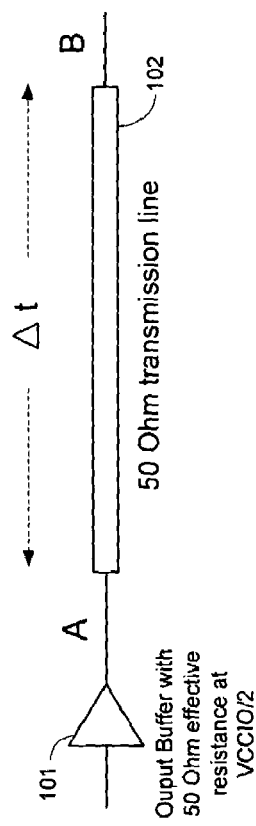
FIG. 1A illustrates a standard output buffer coupled to a 50 ohm transmission line.

On-chip series termination can be provided by controlling the drive current strength of the output transistor(s) in an input or output (IO) buffer, to achieve a desired effective resistance. FIG. 1A illustrates an output buffer 101 coupled to drive signals on a 50 ohm transmission line 102. A signal of half the output swing travels from output buffer 101 and is reflected at an open ended transmission line 102. When the reflected waveform returns to output driver 101, the termination resistance in output buffer 101 causes the reflected signal to return to the full output voltage swing. Because the reflected signal returns to the full voltage swing, the output signal is prevented from reflecting back-and-forth in transmission line 102.

Figure 1B:
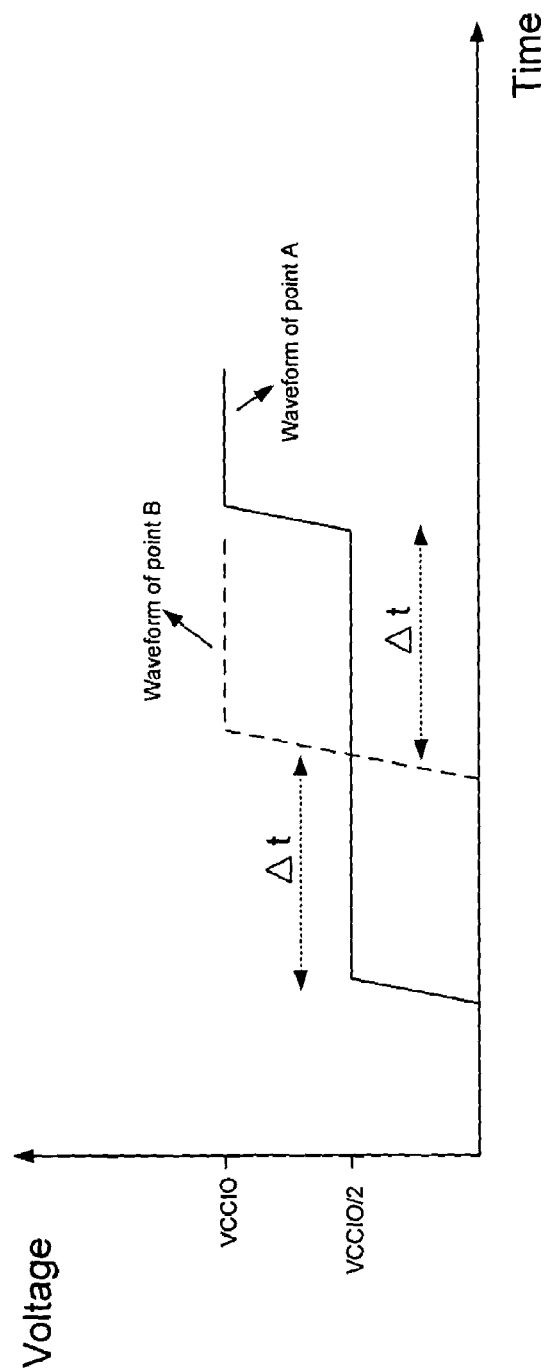
FIG. 1B is a graph that illustrates signal reflections in the transmission line of FIG. 1A.

FIG. 1B shows an example of a waveform that illustrates how signals can be reflected across transmission lines. In this example, the supply voltage is VCCIO, and Δt is the time delay between points A and B on transmission line 102. As shown in FIG. 1B the output signal of buffer 101 reaches the full output voltage swing VCCIO on both ends of the transmission line, A and B, when output buffer 101 is properly terminated.

An IO buffer such as buffer 101 includes pull-up transistors and pull-down transistors that drive signals to an output pin. The on resistance of the pull-up and pull-down drive transistors provide series termination resistance at the output pin. The pull-up transistors are typically parallel coupled PMOS field effect transistors, and the pull-down transistors are typically parallel coupled NMOS field effect transistors. The on resistance of the pull-up transistors is controlled by a PMOS calibration block, and the on resistance of the pull-down transistors is controlled by an NMOS calibration block.

Figure 2:
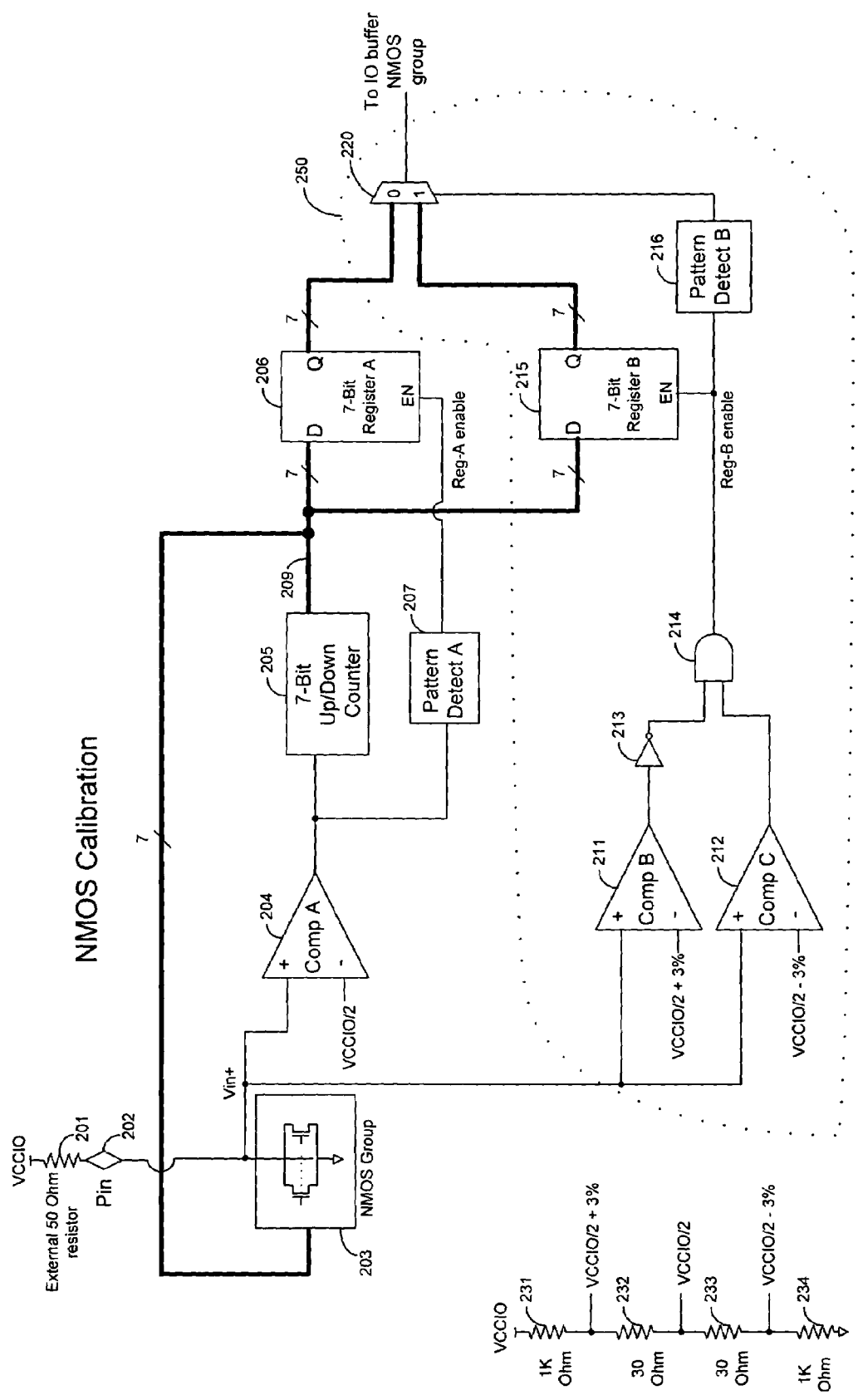
FIG. 2 illustrates an NMOS calibration circuit that controls the termination resistance in an IO buffer according to an embodiment of the present invention.

FIG. 2 illustrates an NMOS calibration block according to an embodiment of the present invention. The NMOS calibration block of FIG. 2 controls the termination resistance of pull-down NMOS transistors in one or more input or output buffers. The NMOS calibration block has a group of parallel coupled NMOS transistors 203 that have different channel width-to-length ratios. Transistor group 203 can have any number of transistors with any suitable channel W/L ratios. For example, transistor group 203 can have 7 parallel coupled transistors that have the following channel W/L ratios, 1×, 2×, 4×, 8×, 16×, 32×, and 64×. Each transistor in NMOS group 203 is typically equivalent in size (channel W/L ratio) to a corresponding pull-down NMOS transistor in the IO buffer. The PMOS and NMOS calibration blocks function in a similar manner.

The PMOS calibration block and the NMOS calibration block each have a calibration pin. In the NMOS calibration circuit of FIG. 2, NMOS transistor group 203 is coupled to calibration pin 202. A user can couple an external resistor 201 to pin 202 to select the series termination resistance for the pull-down NMOS transistors in the IO buffer that are controlled by the NMOS calibration block. The user can couple a corresponding external resistor to the PMOS calibration pin to select the series termination resistance for the pull-up PMOS transistors in the IO buffer that are controlled by the PMOS calibration block.

The external resistor coupled to the calibration pin determines the termination resistance that the calibration block provides to the IO buffer. For example, if a user couples a 50 Ohm external resistor to calibration pin 202, the NMOS calibration block causes the pull-down NMOS transistors in the IO buffer to have about 50 ohms of termination resistance. A 50 ohm resistor 201 is shown in FIG. 2 merely as an example. Any suitable resistor value can be selected.

The effective resistance of NMOS transistor group 203 can be varied by turning on different combinations of the NMOS transistors. The transistors in group 203 and the external resistor 201 create a resistor divider. The voltage Vin+ of this resistor divider is provided to the positive input of comparator 204. The effective resistance of transistor group 203 controls the voltage level at the positive input (Vin+) of comparator 204. Turning on different combinations of the transistors in group 203 causes voltage Vin+ to vary. The negative input (Vin−) of comparator 204 is connected VCCIO/2, where VCCIO is the supply voltage.

If the voltage Vin+ at the positive input of comparator 204 is higher than the voltage at the negative input of comparator 204 (VCCIO/2), the output voltage of the comparator is high. When the output of comparator 204 is high, 7-bit up/down counter 205 causes its output count signals 209 to count up. Specifically, counter 205 causes the digital binary value of its 7 count signals 209 to increase. For example, when the output of comparator 204 is high, the digital value of count signals 209 may increase from 0000001 to 0000010 to 0000011, et., where the ones and zeros correspond to digital high and low voltages, respectively.

The 7 count signals 209 control the gate voltages of the 7 transistors in NMOS transistor group 203. Typically, the least significant bit of the count signals controls the smallest sized transistor in group 203, and the most significant bit controls the largest transistor in group 203. When the binary value of the 7 count signals 209 increases, the effective resistance of transistor group 203 decreases.

If the voltage Vin+ at the positive input of comparator 204 is less than the voltage at the negative input of comparator 204 (VCCIO/2), the output voltage of comparator 204 is low. When the output of comparator 204 is low, the digital binary value of the 7 count signals 209 decreases, causing NMOS group 203 to have more effective resistance.

The voltage Vin+ at the positive input of comparator 204 increases until it rises above half the supply voltage VCCIO/2. After Vin+ initially rises above VCCIO/2, the calibration becomes stable, and voltage Vin+ oscillates across the VCCIO/2 threshold level as shown in the graphs of FIGS. 3A–3B. Each point on the graphs of FIGS. 3A–3B corresponds to a particular binary value of the count signals 209 generated by counter 205.

Thus, the count signal values that correspond to points 301 and 303 result in voltages for Vin+ that are greater than VCCIO/2 as shown in FIGS. 3A–3B. The count signal values that correspond to points 302 and 304 result in voltages for Vin+ that are less than VCCIO/2. In the examples shown in FIGS. 3A–3B, the difference between the peak voltages (301 and 303) and the valley voltages (302 and 304) equals 6% of VCCIO.

Figure 3C:
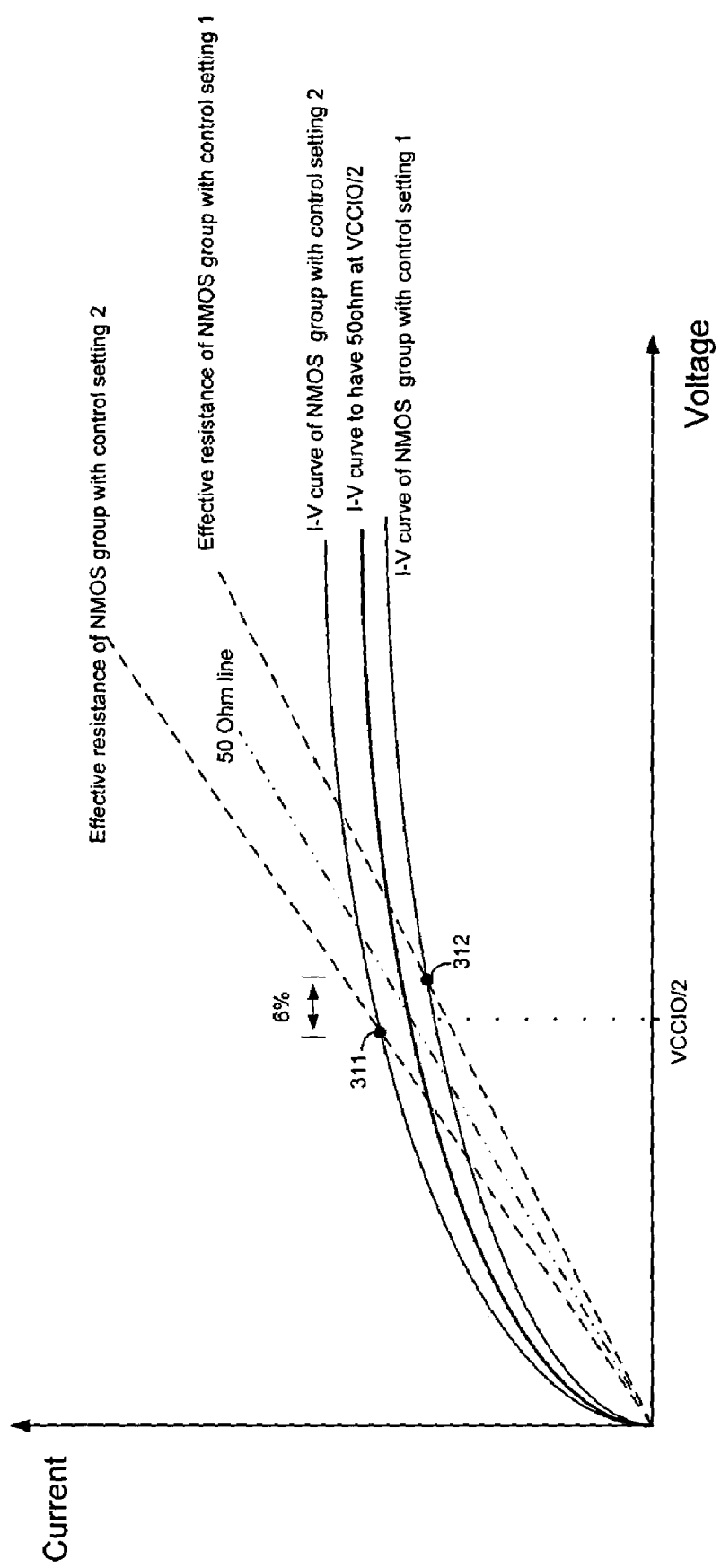

I–V curves that illustrate the voltage and current across NMOS transistor group 203 are shown in FIG. 3C. Points 311 and 312 are two voltage points that Vin+ oscillates between when the calibration becomes stable. Point 311 in FIG. 3C corresponds to point 301, and point 312 corresponds to point 302. The lines that pass through points 311 and 312 represent the effective resistance.

FIGS. 3A–3C illustrate that count signals 209 may not achieve a control setting that causes the effective resistance of the NMOS transistors in group 203 to exactly equal the resistance of external resistor 201. Thus, the voltage Vin+ never exactly equals VCCIO/2 in these examples. Instead, Vin+ oscillates around VCCIO/2 as the control feedback loop that includes comparator 204 and counter 205 attempts to cause Vin+ to equal VCCIO/2.

A pattern detect circuit 207 in FIG. 2 detects the toggling output voltage of comparator 204 and enables 7-bit register 206 to latch the values of count signals 209. Register 206 includes 7 serially coupled flip-flops that latch the 7 count signals 209 on a rising edge of the Reg-A enable signal generated by pattern detect circuit 207.

However, pattern detect circuit 207 cannot distinguish between the situation shown in FIGS. 3A and 3B. Pattern detection circuit 207 always selects the higher voltage control setting where Vin+>VCCIO/2 (e.g., the count signal values for points 301 and 303). Selecting the count signal values that result in a voltage for Vin+ at point 301 is not the best setting for the situation shown in FIG. 3A, because the voltage for Vin+ at point 302 is closer to VCCIO/2 than the voltage for Vin+ at point 301.

The voltage for Vin+ at point 302 corresponds to an effective resistance for transistors 203 that is closer to external resistor 201 that the voltage for Vin+ at point 301. Therefore, it would be desirable to provide a control circuit that selects a digital value for count signals 209 that causes the effective resistance of transistors 203 to be as close to the resistance of external resistor 201 as possible.

The present invention can select the closer voltage point using a voltage range detection circuit that has two additional comparators 211–212, as shown in FIG. 2. First, the resistor network shown in FIG. 2 will be described. The resistor network includes 4 resistors 231–234. This resistor network generates three references voltages. The first reference voltage equals VCCIO/2+3%. The second reference voltage is half the supply voltage VCCIO/2. The third reference voltage equals VCCIO/2−3%.

Comparator 204 receives VCCIO/2 at its negative input. Comparator 211 receives voltage VCCIO/2+3% at its negative input. Comparator 212 receives voltage VCCIO/2−3% at its negative input. These two reference voltages are separated by 6% of VCCIO in the embodiment of FIG. 2, because the difference between the peak and valley voltages of Vin+ when it oscillates around VCCIO/2 is 6% of VCCIO, as shown in FIGS. 3A–3C.

The offset value 6% is the result of the design of NMOS transistor group 203. The offset value 6% is used as an example to illustrate the present invention and is not intended to limit the scope of the present invention. Other offset values can be selected to generate reference voltages at the negative inputs of the comparators 211–212, as will be discussed below.

When voltage Vin+ falls outside the voltage range of VCCIO/2±3%, comparators 211 and 212 cause the Reg-B enable signal to be low. When the Vin+ voltage level falls inside the voltage range VCCIO/2±3%, the output voltage of comparator 211 is low, the output voltage of comparator 212 is high, and logic gates 213 and 214 cause the Reg-B enable signal to be high. When the Reg-B signal is high, 7-bit register B 215 stores in the current value of count signals 209. Register 215 includes 7 serially coupled flip-flops that receive the 7 output signals of counter 205.

When the calibration is stable, the Vin+ voltage level jumps inside and outside of the VCCIO/2±3% voltage range as shown in FIGS. 4A and 4B. FIGS. 4A and 4B illustrate how the circuitry inside bubble 250 is able to select the value of the count signals 209 that results in a voltage for Vin+ that is closest to VCCIO/2.

Referring to FIG. 4A, points 401 correspond to a count signal value that results in voltage for Vin+ that is outside voltage range VCCIO/2±3%. Therefore, at points 401, the Reg-B enable signal is low, and register 215 does not store count signals 209. Points 402 correspond to a count signal value that results in a voltage for Vin+ that is inside voltage range VCCIO/2±3%. When the Reg-B enable signal is high at the first point 402, register 215 stores count signals 209.

Referring to FIG. 4B, points 404 correspond to a count signal value that results in a voltage for Vin+ that is outside voltage range VCCIO/2±3%. Therefore, at points 404, the Reg-B enable signal is low, and register 215 does not store count signals 209. Points 403 correspond to a count signal value that results in a voltage for Vin+ that is inside voltage range VCCIO/2±3%. When the Reg-B enable signal is high at the first point 403, register 215 stores count signals 209.

Thus, register B 215 stores the count signals corresponding to the voltage of Vin+ that is closer to VCCIO/2 for both situations shown in FIGS. 4A–4B. Without circuitry 250, the voltage of Vin+ at points 401 is selected, instead of the voltage closer to VCCIO (at points 402).

When the output voltage of pattern detection circuit B 216 is low multiplexer 220 selects the 7 output signals of Register A 206. The output signals of multiplexer 220 are transmitted to the IO buffer to control the pull-down NMOS transistors that provide series termination at a data input or output pin.

The optimal setting for NMOS transistor group 203 has been reached when the Reg-B enable signal toggles between high and low voltage values. When pattern detection circuit B 216 detects that the Reg-B enable signal is toggling, the output voltage of pattern detection circuit 216 goes high, causing multiplexer 220 to select the 7 output signals of Register B 215. The count signal values stored in register 215 are then used to control the pull-down transistors in the IO buffer.

Figure 4C:
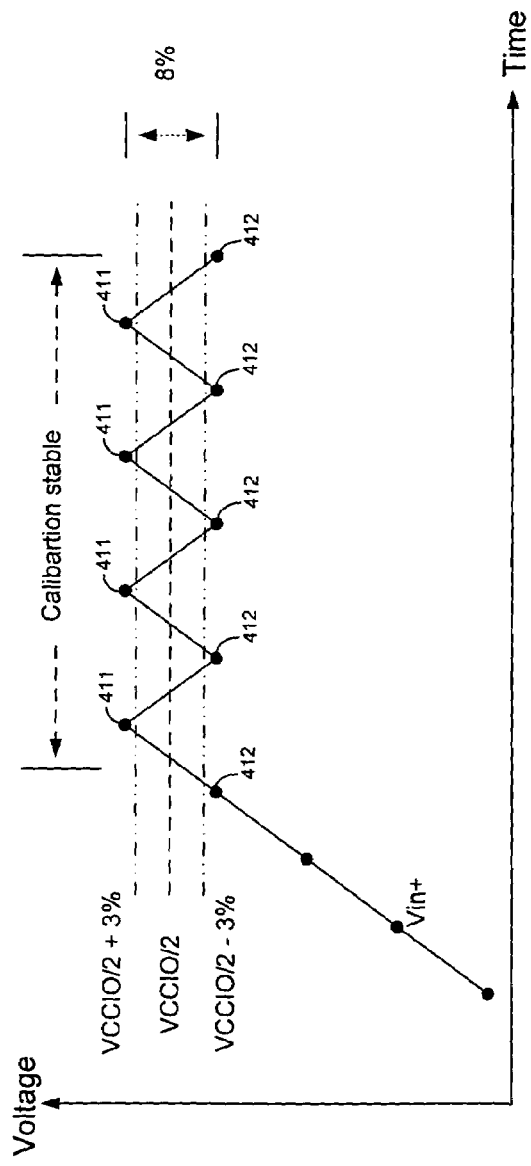

FIG. 4C illustrates a third example of how circuitry 250 is able to select the value of the count signals that results in a voltage closest to VCCIO/2. In FIG. 4C, the voltage Vin+ at the positive inputs of comparators 211–212 increases until Vin+ rises above VCCIO/2, as described above. Subsequently, Vin+ oscillates between the two voltages at points 411 and 412. The voltage at point 411 corresponds to a first value of the count signals. The voltage a point 412 corresponds to a second value of the count signals that is one value greater than the first value at point 411. Thus, there is no value of the count signals resulting in a voltage for Vin+ that is within the voltage range VCCIO/2±3% range.

The on-resistance of the transistors in group 203 determines how much voltage Vin+ increases for each corresponding increase in the count signals. Depending on the sizes of the transistors in group 203, the voltage of Vin+ can fall outside the VCCIO/2±3% range for every value of count signals 209, as shown in FIG. 4C.

In the example shown in FIG. 4C, the difference between Vin+ at points 411 and 412 is 8% of VCCIO/2. If the voltage difference of Vin+ is more than 6% of VCCIO/2 for consecutive count signal values, the Vin+ voltage level may never enter the VCCIO/2±3% range, as shown in FIG. 4C. In this situation, the Reg-B enable signal does not toggle, and therefore, the output of pattern detection circuit B 216 never goes high. Thus, the output signal of pattern detection circuit B 216 remains low, and multiplexer 220 never selects the output of register B 215 to control the pull-down transistors in the IO buffer.

Figure 5:
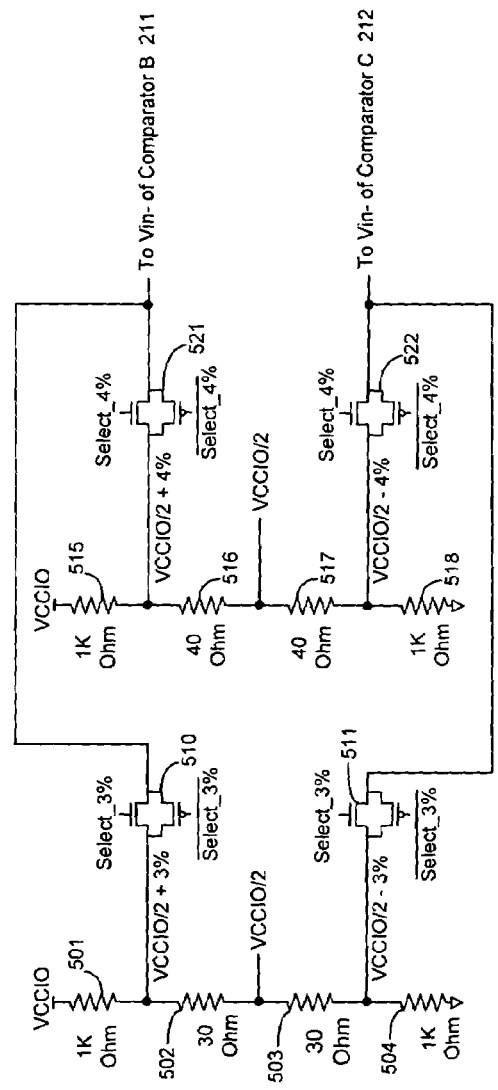
FIG. 5 illustrates a resistor network that controls the voltage range used by comparators in the FIG. 2 circuit, according to an embodiment of the present invention.

The programmable resistor network shown in FIG. 5 solves the problem shown in FIG. 4C. The resistor network of FIG. 5 includes resistors 501–504 and 515–518 and pass gates 510–511 and 521–522. A user can change the voltage detection range of comparators 211–212 by selecting a different resistor path. Signals Select_3% and its inverse signal are coupled to pass gates 510–511, and signals Select_4% and its inverse signals are coupled to pass gates 521–522.

For example, if a user wants to select a voltage range of VCCIO/2±4% for comparators 211–212, the user sets the Select_3% signal to ground to disable resistor path 501–504 by turning off pass gates 510–511. The user sets the Select_4% signal to the supply voltage VCCIO to enable resistor path 515–518 by turning on pass gates 521–522. When resistor path 515–518 is enabled, the voltage at the minus input of comparator 211 is VCCIO/2+4%, and the voltage at the minus input of comparator 212 is VCCIO/2−4%.

If the user wants to select a voltage range of VCCIO/2±3% for comparators 211–212, the user sets the Select_3% signal to VCCIO to enable resistor path 501–504 by turning on pass gates 510–511. The user sets the Select_4% signal to ground to disable resistor path 515–518 by turning off pass gates 521–522. When resistor path 501–504 is enabled, the voltage at the minus input of comparator 211 is VCCIO/2+3%, and the voltage at the minus input of comparator 212 is VCCIO/2−3%.

The proper voltage range should be the difference between the peak and the valley voltages of Vin+ (e.g., at points 411 and 412) after Vin+ begins to oscillate. If the voltage range of comparators 211–212 is too narrow, the situation shown in FIG. 4C occurs. On the other hand, if the voltage range at the minus inputs of comparators 211–212 is too wide, the peak and valley voltages of Vin+ may both fall inside that voltage range when Vin+ oscillates, causing the Reg-B enable signal to remain high. When the Reg-B enable signal remains high, the output of pattern detect B 216 remains low, and never causes multiplexer 220 to select the output of Register B 215. The output of pattern detect B 216 goes high only when the Reg-B signal toggles.

Figure 6:
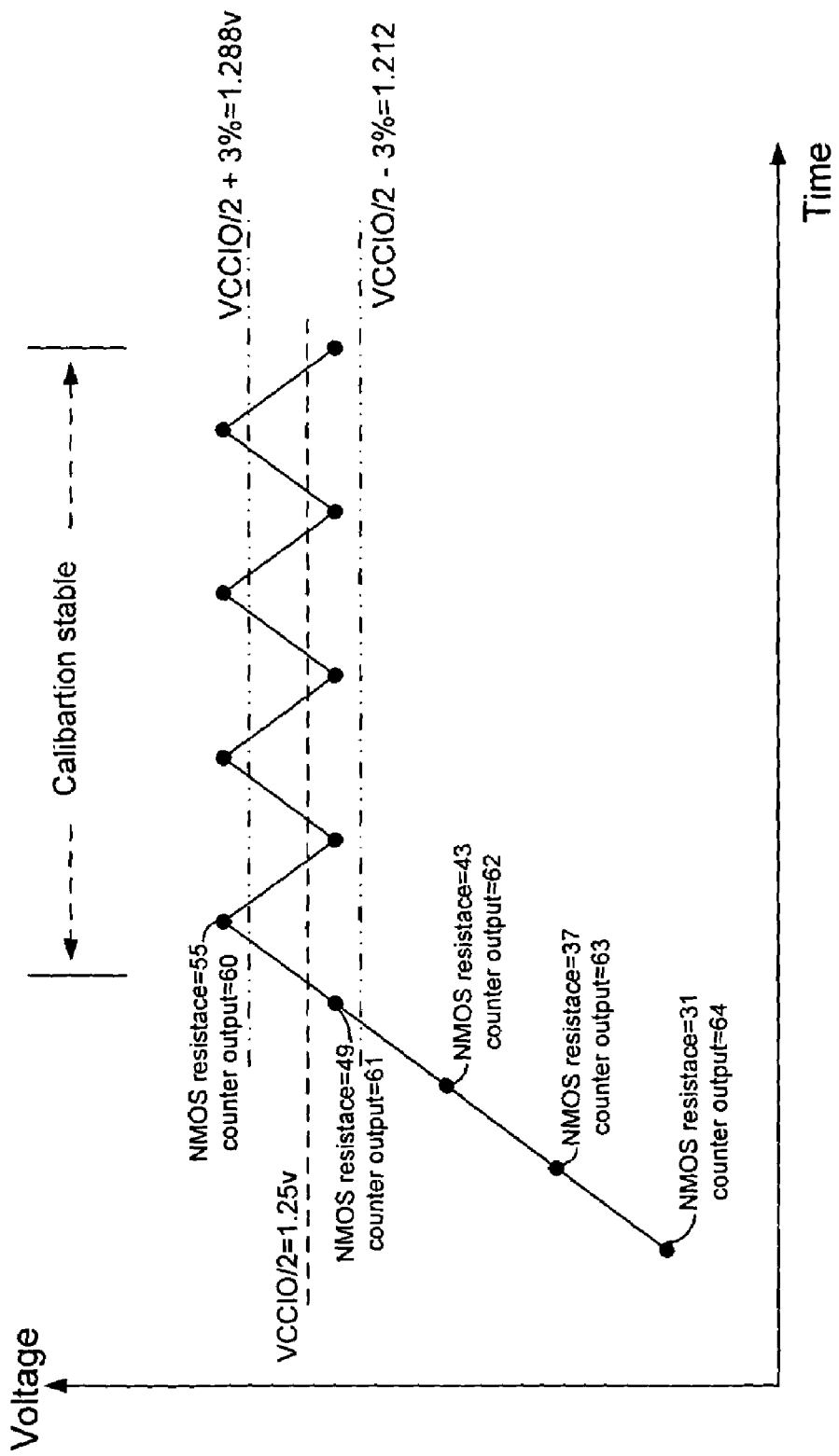
FIG. 6 is another graph that illustrates how changes in the voltage between the external resistor and the group of NMOS transistors shown in FIG. 2 correspond to the count signals and the effective resistance of the NMOS transistors.

FIG. 6 is a graph that illustrates some of the advantages of the present invention. In the example of FIG. 6, the output of counter 205 toggles between 60 and 61 when the calibration is stable. The initial value of the counter output is 64. The supply voltage VCCIO is 2.5 volts. The initial output of counter 205 causes transistors in NMOS group 203 to have an effective resistance of about 31 Ohms. An effective resistance of 31 Ohms translates into a voltage for Vin+ of 31/(31+50)*VCCIO, which is less than VCCIO/2 (the voltage at the minus input of comparator 204).

Therefore, the output of comparator 204 is low, and the value of count signals 209 decreases to 63, which causes effective resistance of NMOS group 203 to be about 37 Ohms. Because the effective resistance is less than 50 Ohms, the output of comparator 204 is still low. The value of count signals 209 then decreases to 62, and the resistance of NMOS group 203 increases to 43 Ohms. The value of count signals 209 continues to decrease, until the resistance of NMOS group 203 is more than 50 Ohms. At that point, the value of count signals 209 toggles between 60 and 61.

Without circuitry 250, the calibration circuit of FIG. 2 provides a count signal value of 60 to the IO buffer, which is not the best setting. Circuit 250, on the other hand, provides a count signal value of 61 to the IO buffer, which is a better setting, because it provides an effective resistance of 49 ohms, which is closer to 50 ohms than the 55 ohms provided by a count value of 60. Comparators 211 and 212 are able to identify a counter output value of 61 as the better setting, because it falls inside the VCCIO/2±3% range.

Figure 7A:
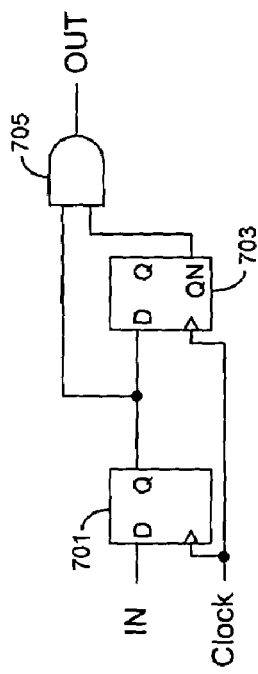
FIGS. 7A–7B illustrate examples of the pattern detection circuits shown in FIG. 2, according to embodiments of the present invention.

FIG. 7A illustrates an example of pattern detect circuit A 207 from FIG. 2. Pattern detect circuit 207 monitors the output signal of comparator 204. When the output signal of comparator 204 toggles from low to high (corresponding to a digital transition of 0→1), the voltage output of pattern detect circuit 207 goes high.

Referring to FIG. 7A, the inputs of AND gate 705 are coupled to the Q output of flip-flop 701 and the QN output of flip-flop 703. The voltage at the QN output of flip-flop 703 is the inverse of the voltage at its Q output. Flip-flops 701 and 703 store the voltage at their D inputs on rising edges of the clock signal. When a low voltage (logic 0) is stored in flip-flop 703, and a high voltage (logic 1) is stored in flip-flop 701, the output of AND gate 705 is a logic high.

Figure 7B:
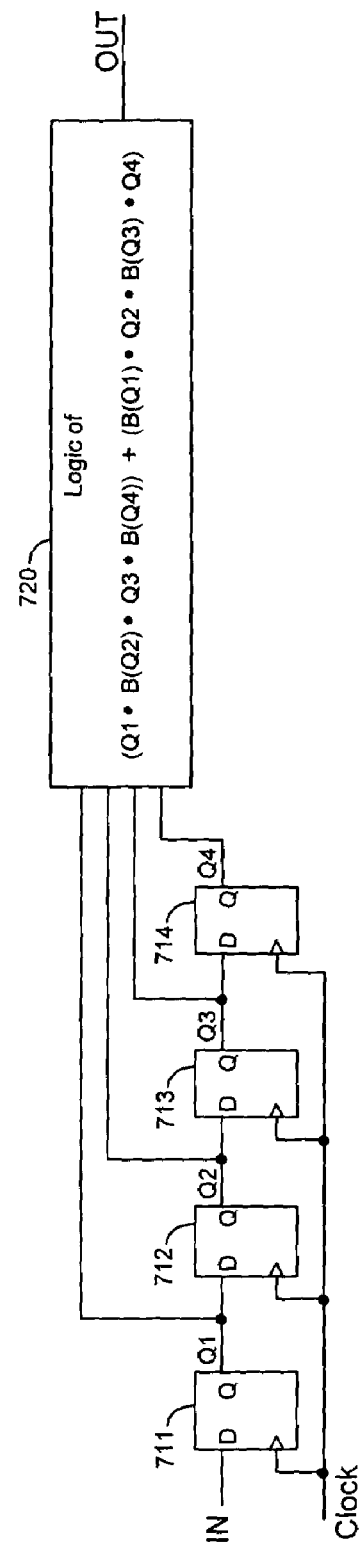

FIG. 7B illustrates an example of pattern detect circuit B 216 in FIG. 2. Pattern detect circuit 216 monitors the output voltage of AND gate 214. When the output voltage of AND gate 214 toggles between logic states 0→1→0→1 or 1→0→1→0, the output voltage of pattern detect circuit 216 goes high. Thus, pattern detect circuit 216 looks for at least three high-to-low or low-to-high transitions in the output of AND gate 214, indicating that Vin+ is oscillating in and out of the voltage range set by comparators 211–212, as shown, for example in FIGS. 4A–4B.

Serially coupled flip-flops 711–714 store the voltages at their D inputs on rising edges of the clock signal. The output voltages of flip-flops 711–714 are Q1–Q4, respectively. Block 720 contains logic gates that implement the logic function, (Q1·B(Q2)·Q3·B(Q4))+(B(Q1)·Q2·B(Q3)·Q4), where refers to an AND function, + refers to an OR function, and B( ) refers to an inverse function.

Figure 8:
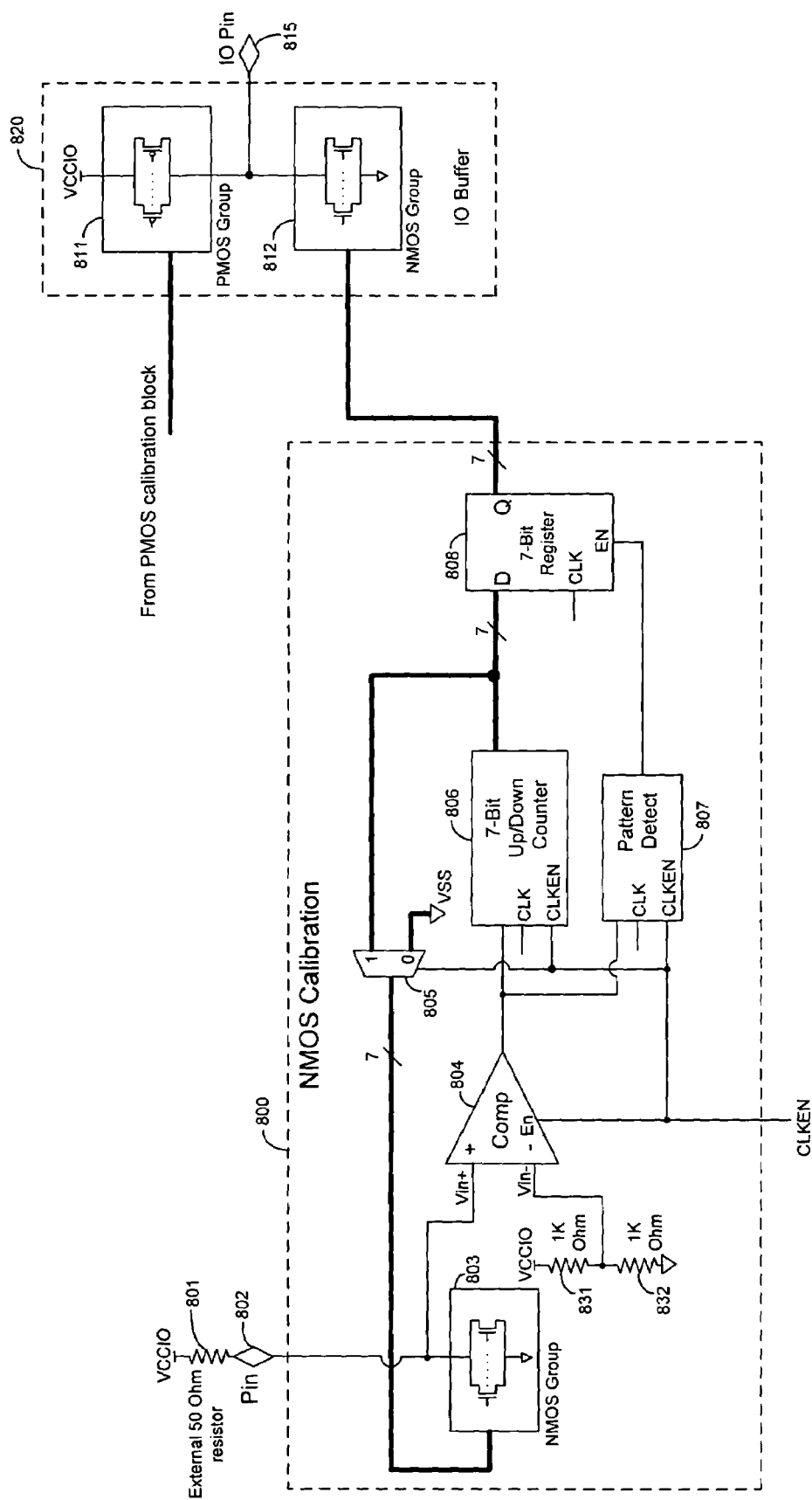
FIG. 8 illustrates an NMOS calibration circuit that controls the termination resistance in an IO buffer and that powers down components in the calibration circuit when a stable termination resistance has been selected, according to an embodiment of the present invention.

FIG. 8 illustrates a further embodiment of an NMOS calibration circuit 800 according to the present invention. In calibration circuit 800, comparator 804 compares the voltage across NMOS transistor group 803 to the reference voltage provided by resistor divider 831/832. NMOS group 803 is coupled to an off-chip resistor 801 through pin 802. Counter 806 causes its 7-bit output signals to count up when the output of comparator 804 is high. Counter 806 causes its 7-bit output signals to count down when the output of comparator 804 is low, as described above with respect to counter 205.

The output of comparator 804 controls counter 806 to adjust the resistance of NMOS group 803, until its resistance settles around the resistance of resistor 801 (50 Ohm in this example). Pattern detect circuit 807 causes register 808 to store the values of the count signals when the output of comparator 804 toggles, as described above with respect to FIG. 7A. The count signals stored in register 808 are used to control the gates of the pull-down transistors in NMOS group 812.

IO buffer 820 includes pull-up and pull-down transistors that drive signals to IO pin 815 and provide termination resistance to IO pin 815. The NMOS transistors in group 812 are pull-down transistors for IO pin 815, and the PMOS transistors in group 811 are pull-up transistors for IO pin 815. PMOS transistors 811 are controlled by a PMOS calibration block (not shown) that is similar to NMOS calibration block 800.

Constant current flow through NMOS transistor group 803 and the 50 Ohm resistor continues after register 808 latches a stable calibration value. For a supply voltage of VCCIO=3.3 volts, the current for the NMOS and PMOS calibration blocks together is about 2×3.3V/(100 Ohm)=66 mA. Comparator 804 also consumes about 6 mA, depending on the comparator design. This constant current consumption creates voltage drop that hurts the performance of other circuit blocks sharing the same power network with calibration block 800. It also creates extra power consumption that is crucial for a modern chip design that has already hit the power dissipation limit.

The techniques of the present invention turn off the transistors in NMOS group 803, the transistors in the PMOS group in the PMOS calibration block, and the comparators, after the calibration is complete.

As shown in FIG. 8, the CLKEN signal controls multiplexer 805, an enable input of comparator 804, counter 806, and pattern detect circuit 807. During the calibration mode, the CLKEN is asserted (high), enabling comparator 804, counter 806, and pattern detect circuit 807. Also, when CLKEN is high, multiplexer 805 selects the count signals generated by counter 806 to control transistor group 803.

When the calibration mode is complete, the CLKEN signal is de-asserted (transitioning low), disabling comparator 804, counter 806, and circuit 807. Also, when CLKEN is low, multiplexer 805 selects the low supply voltage VSS (e.g., ground) for the 7 control signals that control the gates of the 7 transistors in NMOS group 803, causing each of these transistors to shut off. Therefore, substantially no current flows through transistor group 803 or comparator 804.

Figure 9:
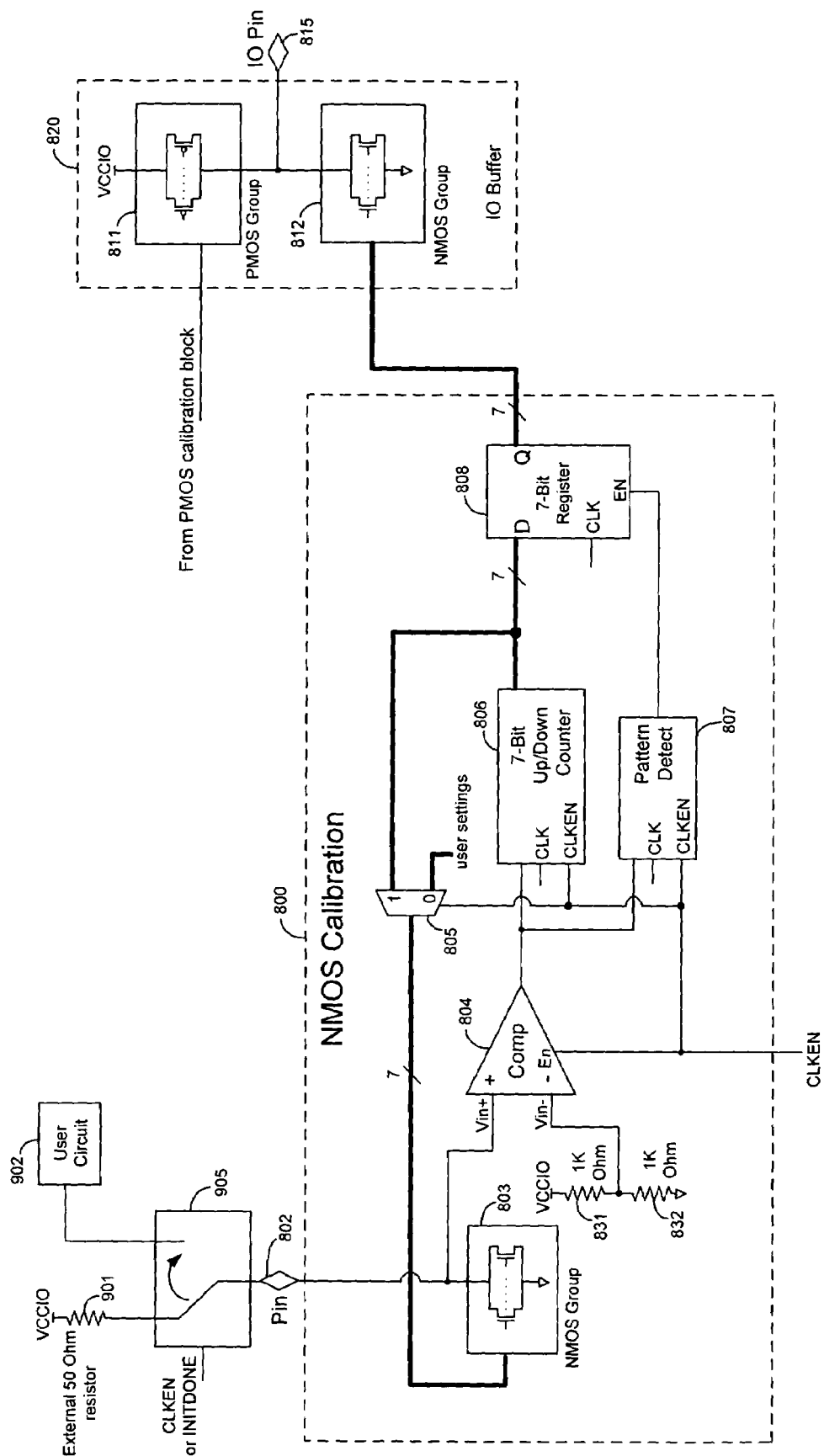
FIG. 9 illustrates an NMOS calibration circuit that controls the termination resistance in an IO buffer and that allows an external calibration pin to used for another purpose when a stable termination resistance has been selected, according to an embodiment of the present invention.

FIG. 9 illustrates another embodiment of the present invention. The embodiment of FIG. 9 allows IO pin 802 to be available for another IO purpose, after the calibration mode performed by circuit 800 is complete. An input of multiplexer 805 is coupled to a user setting that sets the desired transistor drive strength of group 803. A user can couple an analog switch 905 to pin 802 as shown in FIG. 9.

When the calibration is complete, CLKEN transitions low as described above, and multiplexer 805 couples the gates of the transistors in NMOS group 803 to the user setting signals. The user setting signals can now control transistors 803. The analog switch 905 is switched so that pin 802 is connected to user circuit 902 instead of resistor 901. Switch 905 can be controlled by CLKEN or an INITDONE signal. A user can now use a desired drive strength setting to drive transistors 803 to act as an output driver for user circuit 902.

Figure 10:
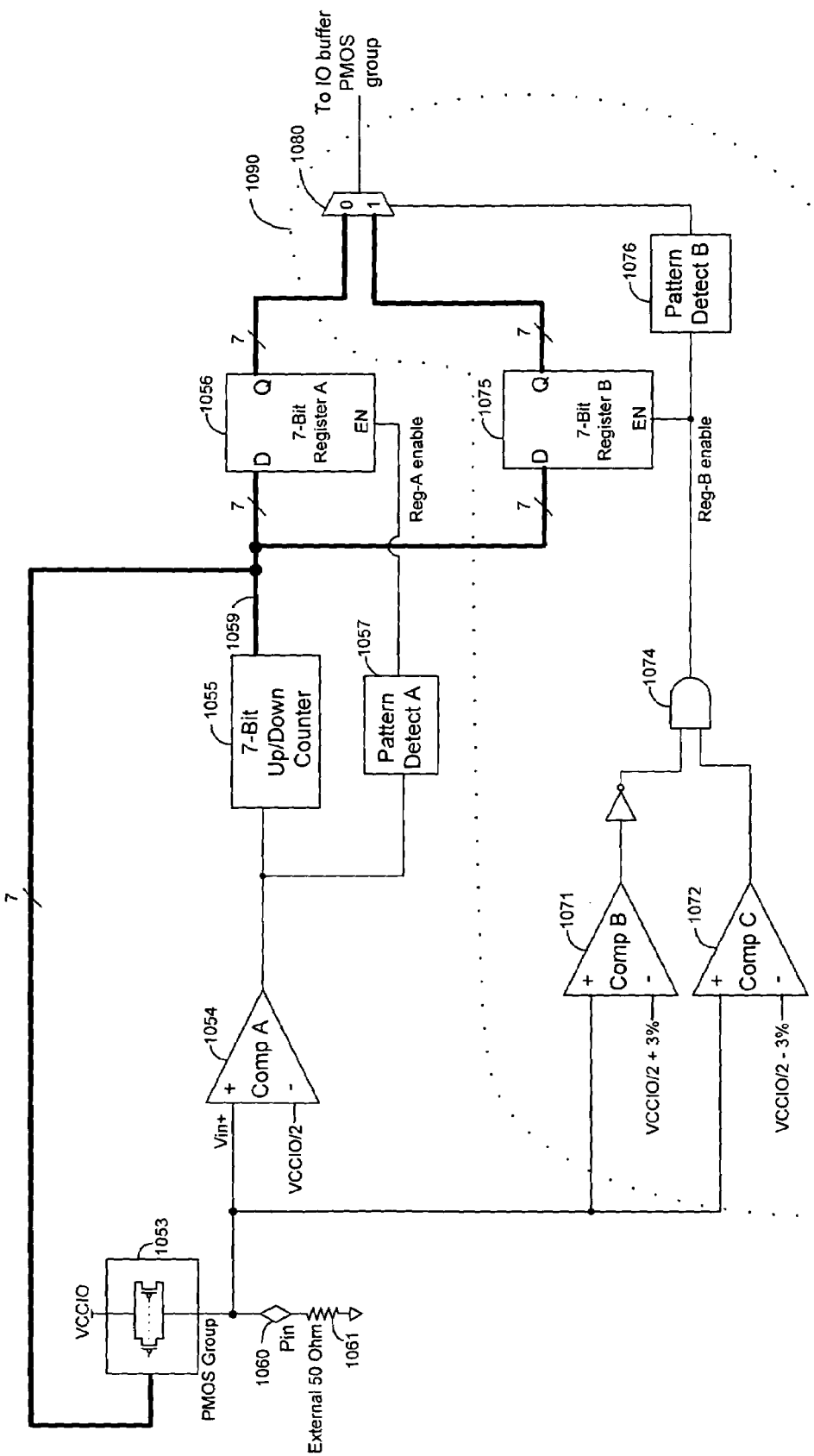
FIG. 10 illustrates a PMOS calibration circuit that controls the termination resistance in an IO buffer according to an embodiment of the present invention.

FIG. 10 illustrates a PMOS calibration circuit according to a further embodiment of the present invention. The PMOS calibration circuit generates control signals that control the termination resistance of the pull-up transistors in PMOS group 811 within IO buffer 820.

The PMOS calibration circuit of FIG. 10 includes a group 1053 of PMOS transistors coupled between a pin 1060 and an external resistor 1061. The calibration circuit also includes a comparator 1054 coupled to PMOS group 1053 and to a reference voltage VCCIO/2. The output of comparator 1054 is coupled to an input of 7-bit up/down counter 1055 and an input of pattern detect circuit 1057. The calibration circuit also includes a 7-bit register 1056.

When the output voltage of comparator 1054 is high, count signals 1059 generated by counter 1055 count up (increasing binary value), causing the effective resistance of PMOS group 1053 to increase. When the output voltage of comparator 1054 is low, count signals 1059 count down (decreasing binary value), causing the effective resistance of PMOS group 1053 to decrease. When pattern detect circuit 1057 senses the output voltage of comparator 1054 is toggling, pattern detect circuit 1057 causes register 1056 to store the values of count signals 1059.

Comparators 1071 and 1072 compare the voltage Vin+ between transistor group 1053 and resistor 1061 with a voltage range defined by VCCIO/2±3%. When voltage Vin+ falls within this voltage range, the output voltage of AND gate 1074 is high, and register 1075 stores count signals 1059. When the output of AND gate 1074 toggles, pattern detect circuit 1076 causes multiplexer 1080 to select the signals stored in register 1075 (instead of the signal stored in register 1056) to control the termination resistance of PMOS group 811.

According to another embodiment of a PMOS calibration circuit, an inverter circuit is coupled between the output of comparator 1054 and the input of counter 1055, and 7 inverter circuits are coupled between each of the outputs of counter 1055 and the gates of transistors in PMOS group 1053. In this embodiment, count signals 1059 count down when the output of comparator 1054 is high, and count signals 1059 count up when the output of comparator 1054 is low.

Figure 11:
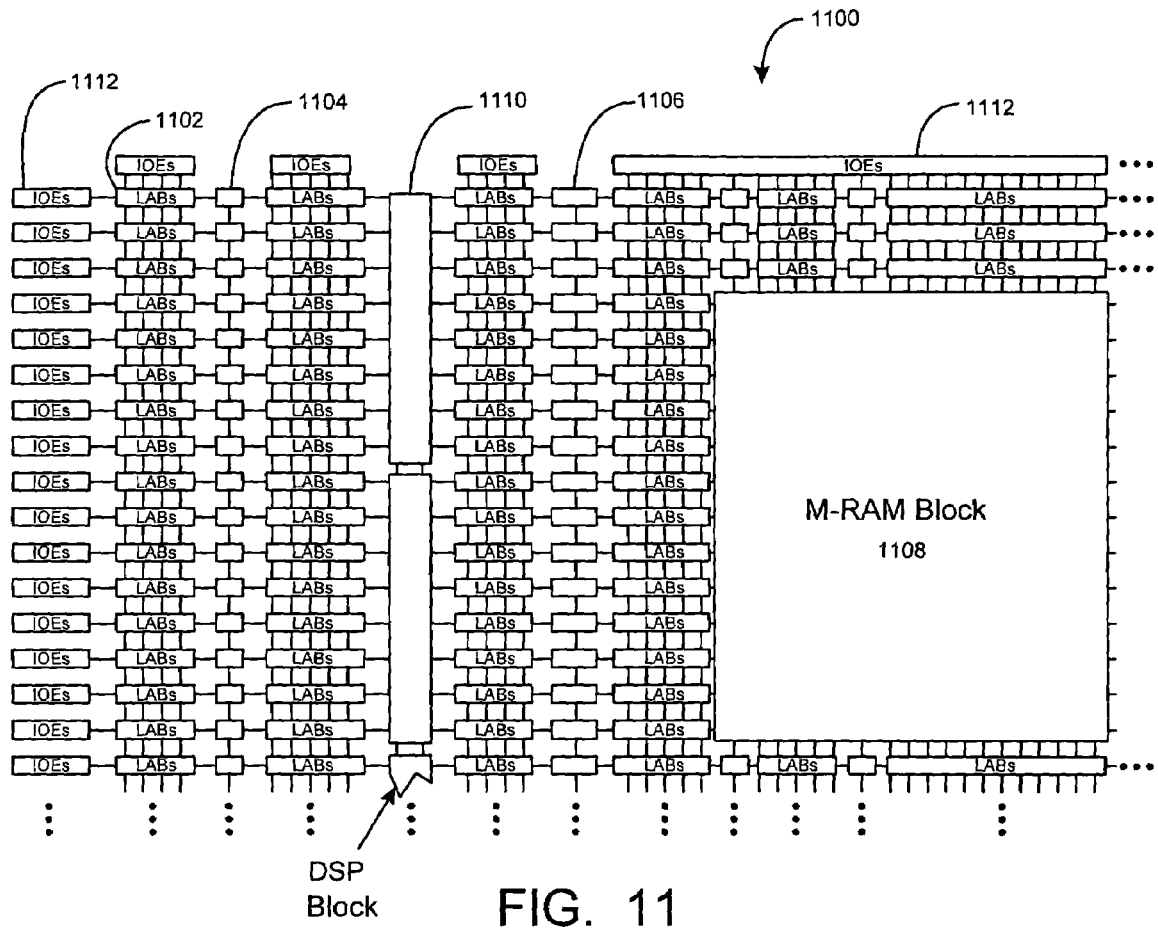
FIG. 11 is a simplified block diagram of a programmable logic device that can be used with the techniques of the present invention.

FIG. 11 is a simplified partial block diagram of one example of PLD 1100 that can include aspects of the present invention. It should be understood that the present invention can be applied to numerous types of integrated circuits such as programmable logic integrated circuits (e.g., field programmable gate arrays) and application specific integrated circuits (ASICs). PLD 1100 is an example of a programmable logic integrated circuit in which techniques of the present invention can be implemented. PLD 1100 includes a two-dimensional array of programmable logic array blocks (or LABs) 1102 that are interconnected by a network of column and row interconnects of varying length and speed. LABs 1102 include multiple (e.g., 10) logic elements (or LEs).

An LE is a programmable logic block that provides for efficient implementation of user defined logic functions. A PLD has numerous logic elements that can be configured to implement various combinatorial and sequential functions. The logic elements have access to a programmable interconnect structure. The programmable interconnect structure can be programmed to interconnect the logic elements in almost any desired configuration.

PLD 1100 also includes a distributed memory structure including RAM blocks of varying sizes provided throughout the array. The RAM blocks include, for example, 512 bit blocks 1104, 4K blocks 1106, and a block 1108 providing 512K bits of RAM. These memory blocks can also include shift registers and FIFO buffers.

PLD 1100 further includes digital signal processing (DSP) blocks 1110 that can implement, for example, multipliers with add or subtract features. I/O elements (IOEs) 1112 located, in this example, around the periphery of the device support numerous single-ended and differential I/O standards. It is to be understood that PLD 1100 is described herein for illustrative purposes only and that the present invention can be implemented in many different types of PLDs, FPGAs, and the like.

Figure 12:
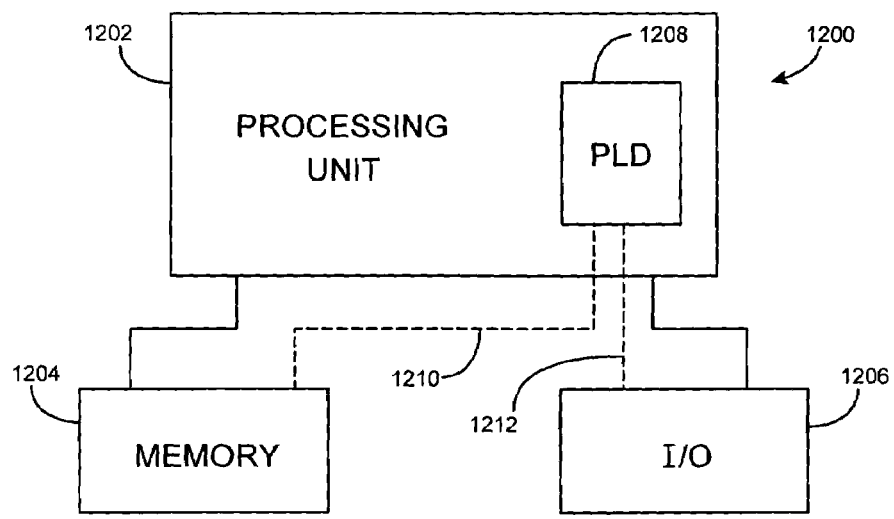
FIG. 12 is a block diagram of an electronic system that can implement embodiments of the present invention.

While PLDs of the type shown in FIG. 11 provide many of the resources required to implement system level solutions, the present invention can also benefit systems wherein a PLD is one of several components. FIG. 12 shows a block diagram of an exemplary digital system 1200, within which the present invention can be embodied. System 1200 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 1200 can be provided on a single board, on multiple boards, or within multiple enclosures.

System 1200 includes a processing unit 1202, a memory unit 1204 and an I/O unit 1206 interconnected together by one or more buses. According to this exemplary embodiment, a programmable logic device (PLD) 1208 is embedded in processing unit 1202. PLD 1208 can serve many different purposes within the system in FIG. 12. PLD 1208 can, for example, be a logical building block of processing unit 1202, supporting its internal and external operations. PLD 1208 is programmed to implement the logical functions necessary to carry on its particular role in system operation. PLD 1208 can be specially coupled to memory 1204 through connection 1210 and to I/O unit 1206 through connection 1212.

Processing unit 1202 can direct data to an appropriate system component for processing or storage, execute a program stored in memory 1204 or receive and transmit data via I/O unit 1206, or other similar function. Processing unit 1202 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 1208 can control the logical operations of the system. In an embodiment, PLD 1208 acts as a reconfigurable processor, which can be reprogrammed as needed to handle a particular computing task. Alternately, programmable logic device 1208 can itself include an embedded microprocessor. Memory unit 1204 can be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. An integrated circuit comprising a calibration circuit that controls a termination resistance in a buffer coupled to a first pin, the calibration circuit comprising:
    first transistors; and
    a control circuit coupled to the first transistors that monitors an effective resistance of the first transistors and that selectively enables a set of the first transistors using control signals generated by a counter circuit, the control circuit selecting values of the control signals corresponding to the effective resistance of the first transistors that is nearest to a resistance value, wherein the selected control signals are used to control a termination resistance of second transistors in the buffer,
    wherein the control circuit comprises:
        a first comparator coupled to monitor a voltage across the first transistors, wherein the counter circuit is coupled to monitor an output signal of the first comparator;
        a first storage circuit coupled to receive the control signals generated by the counter circuit;
        second and third comparators coupled to monitor the voltage across the first transistors; and
        a logic gate coupled to receive output signals of the second and the third comparators, an output signal of the logic gate indicating when the voltage across the first transistors is within a selected voltage range.

2. The integrated circuit defined in claim 1 wherein the first transistors are coupled to a second pin, and the resistance value is a resistance of an external resistor coupled to the second pin.

3. The integrated circuit defined in claim 1 wherein the control circuit further comprises:

a pattern detect circuit coupled to receive the output signal of the first comparator, wherein an input of the first storage circuit is coupled to receive an output signal of the pattern detect circuit.

4. The integrated circuit defined in claim 1 wherein the first comparator has an enable input coupled to an enable signal, the enable signal causing current reduction in the first comparator during a stable calibration state.

5. The integrated circuit defined in claim 1 wherein the control circuit further comprises:
    a second storage circuit coupled to receive the output signal of the logic gate and the control signals generated by the counter circuit; and
    a pattern detect circuit coupled to receive the output signal of the logic gate.

6. The integrated circuit defined in claim 5 wherein the control circuit further comprises:
    a multiplexer having inputs coupled to receive output signals of the first storage circuit and the second storage circuit, the multiplexer having a select input coupled to receive an output signal of the pattern detect circuit.

7. An integrated circuit comprising a calibration circuit that controls a termination resistance in a buffer coupled to a first pin, the calibration circuit comprising:
    first transistors;
    a control circuit coupled to the first transistors that monitors an effective resistance of the first transistors and that selectively enables a set of the first transistors using control signals generated by a counter circuit, the control circuit selecting values of the control signals corresponding to the effective resistance of the first transistors that is nearest to a resistance value, wherein the selected control signals are used to control a termination resistance of second transistors in the buffer; and
    a multiplexer having an output coupled to the first transistors and inputs coupled to the counter circuit and a ground voltage, the multiplexer causing the first transistors to be off during a stable calibration state.

8. An integrated circuit comprising a calibration circuit that controls a termination resistance in a buffer coupled to a first pin, the calibration circuit comprising:
    first transistors;
    a control circuit coupled to the first transistors that monitors an effective resistance of the first transistors and that selectively enables a set of the first transistors using control signals generated by a counter circuit, the control circuit selecting values of the control signals corresponding to the effective resistance of the first transistors that is nearest to a resistance value, wherein the selected control signals are used to control a termination resistance of second transistors in the buffer; and
    a multiplexer having an output coupled to the first transistors and inputs coupled to the counter circuit and user setting signals, the multiplexer causing the first transistors to be coupled to receive the user setting signals during a stable calibration state.

9. An integrated circuit having a calibration circuit that controls a termination resistance of a buffer coupled to a first pin of the integrated circuit, the calibration circuit comprising:
    first transistors;
    a first comparator coupled to compare a voltage across the first transistors with a first reference voltage;

a transistor control circuit coupled to receive an output of the first comparator and generating control signals that selectively enable the first transistors; and a voltage range detection circuit coupled to determine whether a voltage across the first transistors falls within a voltage range, wherein the voltage range detection circuit transmits values of the control signals to the buffer that cause the voltage across the first transistors to fall within the voltage range.

10. The integrated circuit defined in claim 9 wherein the first transistors are coupled to a second pin, and an external resistor is coupled to the second pin.

11. The integrated circuit defined in claim 9 wherein the transistor control circuit comprises a counter circuit that generates the control signals in response to an output signal of the first comparator, and wherein the control signals are count signals.

12. The integrated circuit defined in claim 11 wherein the transistor control circuit further comprises a first register coupled to receive the count signals, and a first pattern detect circuit coupled to receive the output signal of the first comparator and coupled to an input of the first register.

13. The integrated circuit defined in claim 12 wherein the voltage range detection circuit comprises a second comparator coupled to a second reference voltage and a third comparator coupled to a third reference voltage, the second and the third reference voltages defining the voltage range.

14. The integrated circuit defined in claim 13 wherein the voltage range detection circuit further comprises a second register coupled to receive the count signals, and a second pattern detect circuit coupled to receive an output signal generated by the second and third comparators, and wherein an input of the second register is coupled to receive the output signal generated by the second and third comparators.

15. The integrated circuit defined in claim 14 wherein the voltage range detection circuit further comprises a multiplexer coupled to receive output signals of the first and second registers and an output signal of the second pattern detect circuit.

16. The integrated circuit defined in claim 14 wherein an output voltage of the second pattern detect circuit changes states when an output of the second and third comparators makes at least three high-to-low or low-to-high transitions.

17. An integrated circuit comprising a calibration circuit that controls a termination resistance in a buffer coupled to a first pin, the calibration circuit comprising:

first transistors coupled to a second pin;

a first comparator having a first input coupled to the first transistors;

a counter circuit coupled to receive an output signal of the first comparator, wherein count signals generated by the counter circuit selectively enable the first transistors;

a first storage circuit coupled to receive the count signals;

second and third comparators having inputs coupled to the first transistors;

a second storage circuit coupled to receive an output signal of the second and third comparators and the count signals; and a multiplexer that selects a set of control signals stored in one of the first and the second storage circuits and provides the selected control signals to the buffer to select the termination resistance.

18. The integrated circuit according to claim 17 wherein the second and third comparators detect when a voltage across the first transistors is within a voltage range indicating an effective resistance of the first transistors is closest to a resistance of an external resistor coupled to the second pin.

19. The integrated circuit according to claim 18 wherein the multiplexer selects control signals stored in the second storage circuit when a pattern detect circuit detects that the output signal of the second and third comparators is toggling.

20. A method for controlling a termination resistance of a buffer coupled to a first pin of an integrated circuit, the method comprising:

comparing a voltage across first transistors to a first reference voltage using a first comparator;

generating control signals that selectively enable the first transistors;

comparing a voltage across the first transistors to second and third reference voltages using second and third comparators;

storing the control signals in a first storage circuit when an output signal of the first comparator changes state;

storing the control signals in a second storage circuit when the voltage across the first transistors falls between the second and third reference voltages; and selectively coupling the control signals stored in the first and the second storage circuits to the buffer to control the termination resistance.

21. The integrated circuit according to claim 20 wherein selectively coupling the control signals to the buffer further comprises selecting the control signals stored in the second storage circuit to control the termination resistance of second transistors in the buffer when a pattern detect circuit detects that an output signal of the second and third comparators toggles between high and low values.

22. The integrated circuit according to claim 20 further comprising:

turning off the first transistors and disabling the first comparator in a stable calibration state.

23. The integrated circuit according to claim 20 further comprising:

selectively coupling user setting signals to gates of the first transistors in a user mode.

* * * * *